United States Patent [19]

Mirow

[11] Patent Number: 4,573,018
[45] Date of Patent: Feb. 25, 1986

[54] SWITCHING AMPLIFIER SYSTEM

[76] Inventor: Fred Mirow, 47 Edgewood Rd., Westwood, Mass. 02090

[21] Appl. No.: 602,225

[22] Filed: Apr. 19, 1984

[51] Int. Cl.⁴ ............................................. H03F 3/38
[52] U.S. Cl. .................................................... 330/10
[58] Field of Search ...................... 330/10, 207 A, 251

[56] References Cited

U.S. PATENT DOCUMENTS 3,829,788  8/1974  Ford ..................................... 330/10

FOREIGN PATENT DOCUMENTS 1248209  9/1971  United Kingdom .................. 330/10

OTHER PUBLICATIONS

Cocconi et al, "High-Frequency Isolated 4 kW Photovoltaic Inverter for Utility Interface", *Power-Conversion International*, May 1984, pp. 26, 28–30, 32, 36–38, 41–48.

*Primary Examiner*—James B. Mullins
*Attorney, Agent, or Firm*—Ratner & Prestia

[57] ABSTRACT

A switching amplifier wherein the high frequency carrier voltage modulated by an audio input signal is passed through a transformer. The carrier voltage is demodulated and non-audio signals are removed. The audio signal is then recovered and fed to speaker means.

2 Claims, 3 Drawing Figures

SWITCHING AMPLIFIER SYSTEM

BACKGROUND OF THE INVENTION

Audio power amplifiers known to the art generally operate at a relatively low efficiency. To achieve greater efficiency, switching amplifiers have been employed, but these amplifiers still require a large audio frequency transformer if a transformer coupling to the load is employed.

U.S. Pat. No. 1,874,159, issued Aug. 30, 1932 is directed to an apparatus for amplifying an electric signal comprising a source of direct current, a load circuit, an interconnection between said source and said circuit including an inductive winding (transformer), a pair of electric valves (switches), each provided with a control element, means for energizing said control elements with a periodic potential of a frequency relatively high with respect to that of the signal and of an amplitude greater than that of the signal and means for modulating said high frequency potential with said signal.

U.S. Pat. No. 4,016,501, issued Apr. 5, 1977 is directed to a switching amplifier system which includes a pulse width modulator for converting a bipolar input signal into a train of unipolar pulses having durations which vary with the instaneous amplitude of the input signal. The pulses control the energizing of a series switch which supplies current to a switching bridge circuit. The switching arms of the bridge circuit are controlled by the polarity of the input signal. A path is provided for output current when the switch is open. The output current is filtered to remove fluctuations at the switching rate and applied to a load. It is stated that the amplified output voltage signal accurately follows the input signal, and the efficiency of conversion of DC power to AC power can approach 100 percent.

U.S. Pat. No. 3,585,517, issued June 15, 1971 is directed to a power amplifier which comprises pulse width modulating mean responsive to an input signal for producing an essentially square wave signal in which the width of the pulses is proportional to the instantaneous amplitude of the input or reference signal. Connected between the terminals of a source of supply voltage is an electric load device, a switch device such as a transistor and an inductor. The pulses periodically close the switches so that a portion of the voltage from the supply will appear across the inductor. When the switch opens upon termination of a pulse in the square wave, the energy stored in the inductor is discharged through the load device whereby unwanted voltage is stored in the inductor and discharged though the load device rather than being dissipated within the amplifier circuit elements.

U.S. Pat. No. 3,629,616, issued Dec. 21, 1971 is directed to an audio amplifier circuit wherein two 180° out-of-phase audio signals are respectively applied to first and second comparators which compare the audio signals with a reference signal to produce two pulse-width modulated signals. The latter signals are applied to switching semiconductors connected in the two arms of a bridge which includes the transducer.

U.S. Pat. No. 2,990,516, issued June 27, 1961 is directed to a pulse width modulated amplifier and method which involves converting an input signal into a train of pulses time- or width-modulated in accordance with a function related to the amplitude of the signal, then amplifying said signal with a class B amplifier, and recovering an amplified signal corresponding to the original input signal.

U.S. Pat. No. 3,384,838, issued May 21, 1968, is directed to a phase reversible switching power amplifier wherein a low power pulse width modulator controls an electronic switch which is selectively connected to a positive and negative source of direct current. A signal to be amplified controls the width of the output pulses from the pulse width modulator and these pulses control the operation of the switch to connect to the positive direct current source when the signal is positive and to the negative direct current source when the signal is negative. The pulses resulting from the alternate connector to the direct current sources are then averaged to produce an output voltage which is linearly proportional to the input signal.

U.S. Pat. No. 4,092,610, issued May 30, 1978 is directed to a system for amplifying an input signal. The invention provides for the modulation of an input signal upon a carrier signal by a pulse duration modulator wherein the durations or widths of sequential pulses of the carrier signal are varied in accordance with variations in the amplitude of the input signal. The system includes a plurality of amplifier units which are sequentially operated for amplifying the modulated carrier signal and for coupling the modulated carrier signal to a load. Filter circuitry coupled between the plurality of amplifying units and the load provides a pass band which passes the spectrum of the input signal, the pass band being sufficiently narrow to exclude harmonics of the input signal and the carrier from the load.

A high efficiency audio amplifier has now been found which is not susceptible to the deficiencies of the prior art.

SUMMARY OF THE INVENTION

The present invention is directed to a high efficiency audio amplifer which provides a means for replacing the audio transformer in the circuit with a smaller high frequency transformer which provides isolation between power source and load and/or provides impedence matching. It is well known that for a given transformer size that as the frequency of the applied voltage increases the power rating also increases. In the present invention, there is no audio frequency current buildup so there is no requirement for a large transformer.

In the switching amplifier of the present invention the high frequency carrier voltage modulated by an audio input signal is passed through transformer; the carrier voltage is demodulated and the audio signal is recovered and fed to the speaker. In the present invention, the average transformer magnetizing current is forced to be zero. This causes the transformer to operate substantially symmetrically around the zero flux point and the necessity for a larger transformer is obviated.

The audio amplifier of the present invention may be employed in many well-known circuits, such as push-pull full-bridge, half-bridge, etc. Also, other less effective in terms of transformer usage, curcuits may be used, such as the flyback. These circuits only force the transformer current to be returned to zero. For convenience, it will be described in detail in terms of the following circuit.

The novel audio amplifier of the present invention comprises: means for modulating the audio input signals to generate two pulse trains of constant repetition rate and amplitude; means for amplifying and passing the high frequency modulated carrier voltage through a high frequency transformer; means for demodulating said carrier voltage whereby the magnitude of the audio signal is recovered; filtering means to remove non-audio signals; and polarity detector means for providing audio signal to the load in accordance with the polarity of the input signal.

In accordance with the present invention, the amplifier system of the present invention includes a full wave rectifier which converts the AC input signal into a positive output equal to the magnitude of the input; a pulse width modulator for converting the applied input signal from the rectifier into two pulse train outputs of constant repetition rate and amplitude and equal duty cycles. The duty cycles vary in accordance with the magnitude of the input signal from the rectifier. As the input varies from 0 to maximum amplitude the duty cycle of the pulses varies from 0 to 50%. Thus, the two output pulses are identical but occur alternately and thus never overlap. Electronic switches for each pulse train are opened and closed in response to the presence or absence of a pulse. The length of time each switch is closed corresponds to the width of the pulse supplied. A transformer converts the voltage applied to its primary to another voltage at its secondary as determined by its fixed turn ratio. The transformer is driven at a very high frequency symmetrically (no DC component) so that the transformer can be very small for a given output power. Diodes of a full wave rectifier detector rectify the AC output of the transformer to pulsating DC thereby providing two outputs; one of positive pulsating DC and one of negative pulsating DC. A low pass filter removes the switching pulses leaving the average value, i.e., the carrier wave is removed and only the audio signal is left. A polarity detector, which constitutes the second path to which the input signal is applied, the first being the path described above, indicates to switches to which the input audio signals from the low pass filter is connected, the polarity of the original input signal thereby opening and closing the switches one at a time providing an AC signal to the load with no DC offset.

DETAILED DESCRIPTION OF THE INVENTION

The term audio, as used herein is intended to refer to any signal low in frequency when compared to the switching frequency ($\frac{1}{2}$ Fc). The term Fc refers to the frequency that determines the rate of the pulse train repetition.

Figure 1:
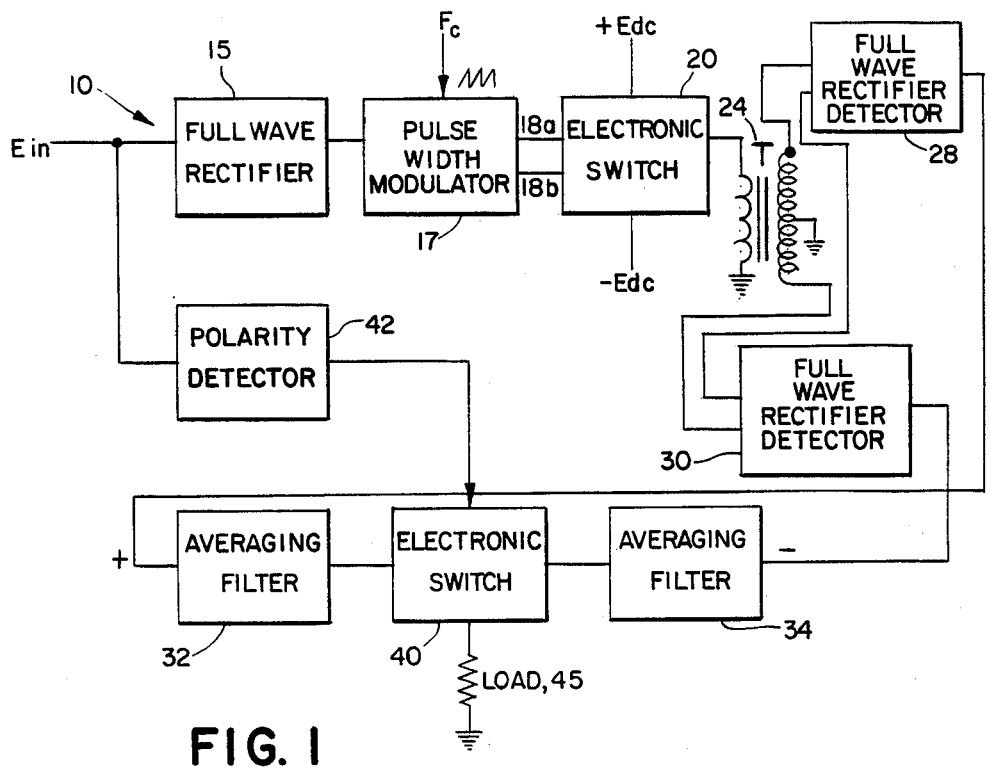
FIG. 1 is a block diagrammatic representation of the present invention.

Referring now to FIG. 1, the input signal (Ein) which may be an audio signal or any signal with a frequency of less than about 1/10 of Fc is applied at terminal 10, where this input wave is applied to two paths. The first path includes full wave rectifier 15, pulse width modulator 17, electronic switch 20, transformer 24, full wave rectifier detectors 28 and 30, and averaging filters 32 and 34. The second path includes polarity detector 42 which is connected to electronic switch 40 where both paths meet and where they are conntected to load 45 through switch 40.

Full wave rectifier 15 multiplies a negative input by −1 and a positive input by +1 so that the output is always positive. Pulse width modulator 17, coupled to rectifier 15 operates at a fixed frequency in the range of about 80 to 500 KHz, preferably about 200 KHz and generates two pulse train outputs 18a and 18b which are of subtantially constant repetitive rate ($\frac{1}{2} \times$ Fc) and amplitude. The duty cycle varies in accordance with the magnitude of the input signal. Thus, as the input to pulse width modulator 17 varies from a 0 to a maximum amplitude, the duty cycle of the pulses varies from 0 to 50%. The two pulse trains are identical, i.e., the widths of the pulses produced are equal, except that the pulses occur sequentially and do not overlap. Pulses 18a and 18b are applied to electronic switch 20 which alternately connects the primary of the transformer to a positive direct voltage potential +EDC or a negative direct voltage −EDC depending upon the presence of applied pulse 18a or 18b. Thus, when a particular pulse is present, the corresponding portion of the switch is on. This stage also provides the power gain. Transformer 24 provides impedance matching and/or isolation. The secondary is centertapped so that the ends are of opposite polarity by a substantially equal amount. Full wave rectifier dectector 28 converts the AC voltage from transformer 24 into a pulsating positive direct current signal while full wave rectifier detector 30 converts the AC voltage from transformer 24 into a pulsating negative direct current signal. The signals from detector 28 passes to averaging filter 32 where the flow of all frequencies above the audio frequency band (about 15 KHz) are blocked. Similarly, averaging filter 34 receives the signal from detector 30, also blocking the flow of all frequencies above the audio frequency band. The audio frequency from full wave rectifier 15 is reconstructed and is present at the output of averaging filters 32 and 34 except with opposite polarity. Electronic switch 40 receives the signals from averaging filters 32 and 34 and is controlled by polarity detector 42. Polarity detector 42 functions to permit a positive output signal to load 45 when the input signal Ein is positive and a negative output signal to load 45 when the input signal Ein is negative so that the original input signal is duplicated across load 45 except at a higher power.

Figure 2:
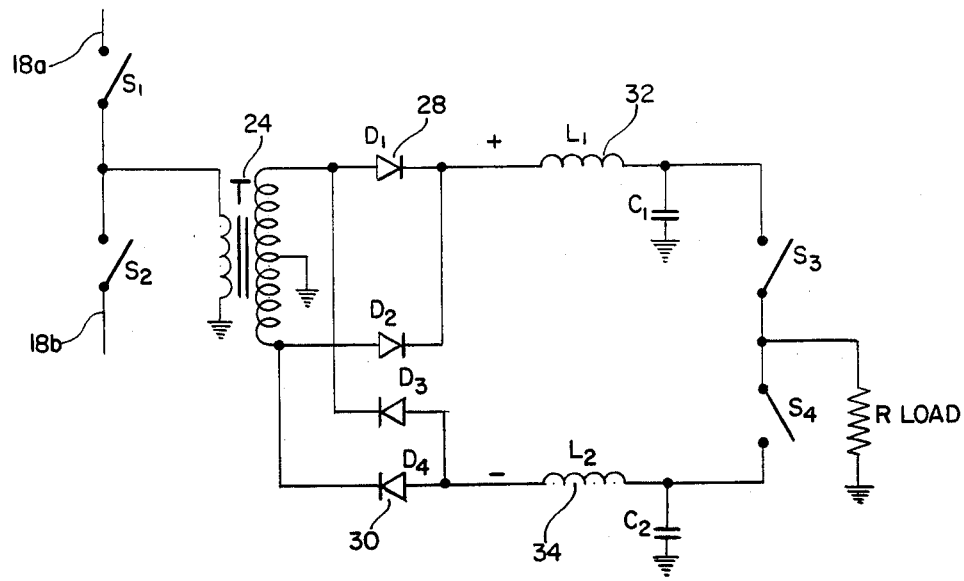
FIG. 2 is a partial schematic circuit diagram of one embodiment of the present invention.

For further explanation of the schematic diagram of the amplifier system of the present invention set forth in FIG. 1, reference should be had to FIG. 2 where the output from pulse width modulator 17 is illustrated by lines 18a and 18b. Electronic switch 20 consists of switches $S_1$ and $S_2$ which alternately connects the primary of transformer 24 to the +Dc supply when $S_1$ is energized and to the −Dc supply when $S_2$ is energized. Full wave rectifiers 28 and 30 consist of diodes $D_1$ and $D_2$, and $D_3$ and $D_4$ respectively, which converts the AC voltage from transformer 24 into pulsating +DC current, in the case of rectifier 28, and pulsating −DC current in the case of rectifier 30, averaging filter 32 consisting of $L_1$ and $C_1$ receives the pulsating +Dc current output from detector 28 and blocks the flow of all frequencies above the audio frequency band. Similarly, averaging filter 34 consisting of $L_2$ and $C_2$ receives the pulsating −DC current output from detector 30 and blocks the flow of all frequencies above the audio frequency band. The electronic switches are controlled by the pulse trains (output of modulator) such that when a given pulse is present its associated switch is on. This provides an output voltage across the transformer of opposite polarity but equal in amplitude. The AC voltage output of the transformer is converted by one full wave rectifier detector into pulsating +DC as shown and by another full wave rectifier detector to into pulsating −DC. Each pulse is applied to a different averaging filter (32 and 34) which blocks the flow of all frequencies above the audio frequency band. The output of the audio signals from averaging filters 32 and 34 are controlled by electronic switch 40 which consists of S3 and S4, respectively. Switches S3 and S4 are alternately energized in response to a signal from polarity detector 42 (not shown in FIG. 2) so that the output voltage signal to load 45 is identical to the input signal except in power level.

Figure 3:
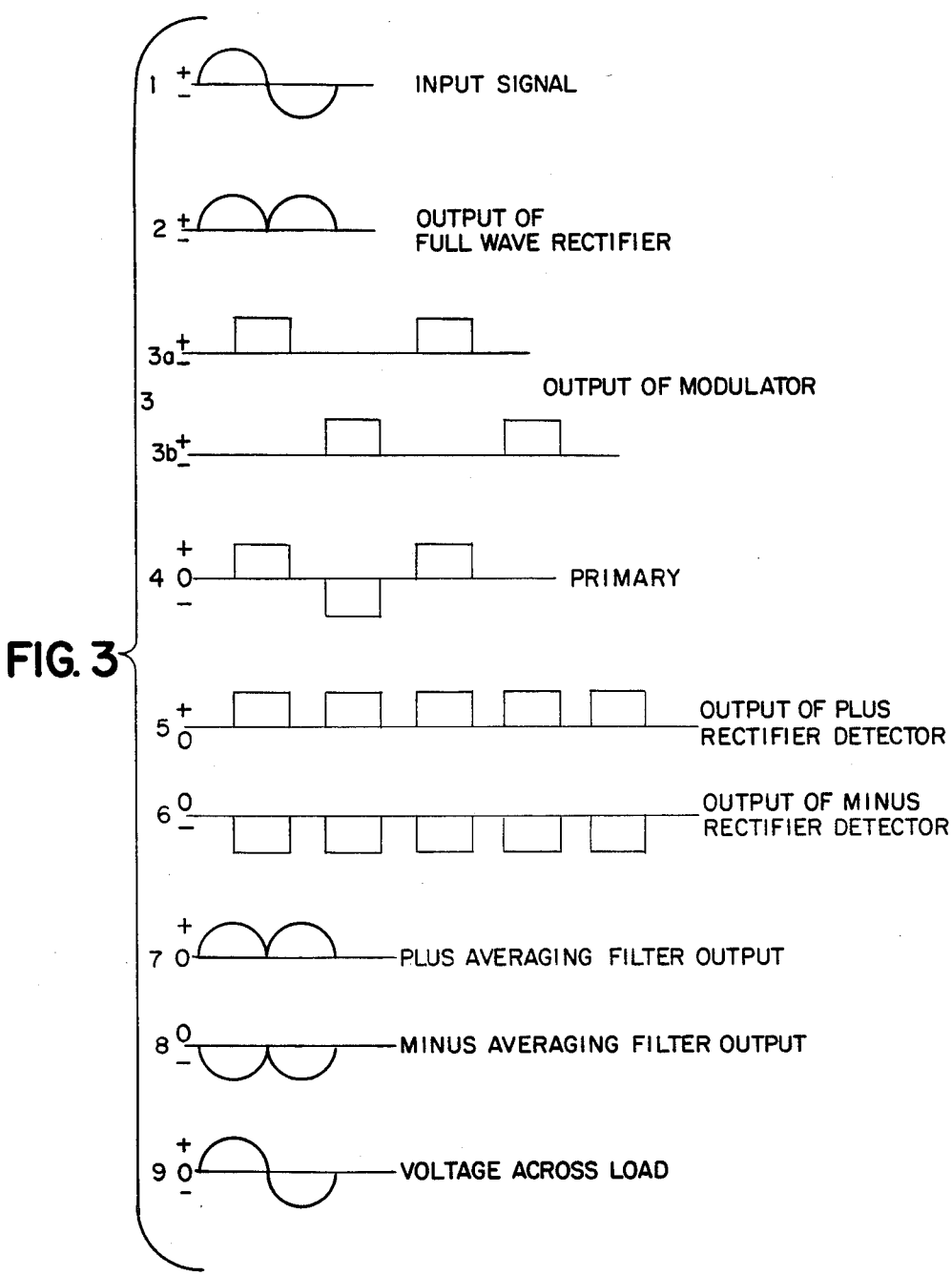
FIG. 3 is a graphic representation of the waveforms generated by the elements of the circuit described in FIGS. 1 and 2.

FIG. 3 illustrates waveforms generated at various points in the circuit. FIG. 3—1 represents the input signal, e.g., an audio signal and is illustrated as a sinusoidal wave. This audio signal is converted by the full wave rectifier to an output signal that is always positive, as shown in FIG. 3-2. The positive output signal from the full wave rectifier is received by the pulse width modulator which converts it into two pulse trains, FIGS. 3—3a and 3b, which are of constant repetition rate and amplitude but with a duty cycle which varies in accordance with the magnitude of the input signal. It will be seen that the two pulse trains are identical, i.e., the widths of the pulses are equal, but the pulses occur sequentially and never overlap. The output voltage across the transformer is shown in FIG. 3-4. FIG. 3-5 illustrates the pulsating +DC provided by one full wave rectifier detector from the AC voltage output of the transformer and FIG. 3-6 illustrates the pulsating −DC provided by the second full wave rectifier. The output of the averaging filter is illustrated in FIG. 3-7 (+pulses) and FIG. 3-8 (−pulses). The output of the averaging filters is fed to electronic switches which are controlled through a polarity detector to the input signal (FIG. 3-1) so that either the positive magnitude or the negative magnitude of the signal is provided to the load, whereby the output signal to the load (FIG. 3-9) is identical to the input signal (FIG. 3-1) except in power level.

From the foregoing is will be seen that by replacing the audio transformer of the prior art with a smaller high frequency transformer very high efficiency can be maintained with a reduction in weight and size.

What is claimed is:

1. An audio amplifier system comprising:
   a source of audio input signal;
   means to pulse width modulate at least one high frequency pulse train with the audio input signal
   means for providing a power gain to the modulated pulse train and passing the modulated pulse train through a high frequency transformer;
   means for demodulating the modulated pulse train whereby the increased magnitude of the audio input signal is recovered and for filtering the recovered signals to remove non-audio signals;
   polarity detector means for providing audio signal to a load in accordance with the polarity of the input signal.

2. An audio amplifier system comprising:
   a source of audio input signal;
   a full wave rectifier for converting the AC input signal into a positive output equal to the magnitude of the input;
   a pulse width modulator for converting the applied input signal from said rectifier into two pulse train outputs of constant repetition rate and amplitude and equal duty cycles;
   an electronic switch for each pulse train adapted to open and close in response to the presence or absence of a pulse;
   a transformer having a secondary centertapped whereby the ends are of opposite polarity by a substantially equal amount;
   a first full wave rectifier for converting the positive AC voltage from said transformer into a pulsating positive direct current signal;
   a second full wave rectifier for converting the negative AC voltage into a pulsating negative direct current signal;
   first and second averaging filters for blocking the flow of frequencies above the audio frequency band whereby the audio signal is reconstructed;
   an electronic switch for alternately connecting a load to said first and second averaging filters; and
   a polarity detector for controlling said electronic switch.

* * * * *